USOO5208961A

United States Patent [19]
Lajoie

[11] Patent Number: 5,208,961
[45] Date of Patent: May 11, 1993

[54] SEMICONDUCTOR PROCESSING FURNACE DOOR ALIGNMENT APPARATUS AND METHOD

[75] Inventor: Marc S. Lajoie, Grand Prairie, Tex.

[73] Assignee: National Semiconductor Corporation, Santa Clara, Calif.

[21] Appl. No.: 843,537

[22] Filed: Feb. 28, 1992

[51] Int. Cl.⁵ .................... B23P 19/04; F27D 1/18
[52] U.S. Cl. ...................................... 29/434; 29/235; 29/238; 432/253
[58] Field of Search ............... 29/434, 436, 281.1, 29/281.6, 282, 235, 238; 414/180, 181, 182, 183, 217, 684.3, DIG. 6; 432/11, 239, 242, 250, 253

[56] References Cited

U.S. PATENT DOCUMENTS

| 4,526,534 | 7/1985 | Wollmann | 432/11 |
| 4,543,059 | 9/1985 | Whang et al. | 432/239 X |
| 4,624,638 | 11/1986 | Sarkozy | 414/180 X |
| 4,943,234 | 7/1990 | Söhlbrand | 432/253 X |
| 4,979,897 | 12/1990 | Yates | 432/253 X |

FOREIGN PATENT DOCUMENTS 2432422 1/1976 Fed. Rep. of Germany ...... 432/253

Primary Examiner—Mark Rosenbaum
Assistant Examiner—Peter Dungba Vo
Attorney, Agent, or Firm—Richards, Medlock & Andrews

[57] ABSTRACT

Wafer processing furnace apparatus for providing adjustability for a door sealed to the furnace, the furnace being of the type having a door through which a wafer paddle is disposed. An alignment collar is disposed in the furnace door and having a bore through which the wafer paddle passes. The bore is offset so that when the collar is rotated, the door is moved in a plane perpendicular to the paddle axis. The door includes a seal assembly, including a bellows that is sealed with an O-ring at one end of the door, and sealed with an O-ring at another end to an alignment plate which also has an offset bore. The alignment plate and the bellows is rotated in correspondence with the alignment collar when adjusting the door to prevent tilting thereof. The alignment plate is fastened to an attachment plate which is fixed to the wafer paddle.

22 Claims, 2 Drawing Sheets

SEMICONDUCTOR PROCESSING FURNACE DOOR ALIGNMENT APPARATUS AND METHOD

TECHNICAL FIELD OF THE INVENTION

The present invention relates in general to semiconductor processing furnaces, and more particularly to apparatus and techniques for aligning a diffusion furnace door to allow adjustment of the paddle assembly while yet maintaining the furnace door aligned and sealed to the furnace unit.

BACKGROUND OF THE INVENTION

The fabrication of semiconductor circuits involves many process steps for forming active and passive components in a semiconductor substrate. Many of the processing steps are carried out at high temperatures for depositing dopants or materials in or on the surface of the semiconductor wafer. Furnaces especially adapted for processing semiconductor wafers in a controlled environment are commercially available. Wafer processing furnaces generally include a quartz cylinder in which the wafers are disposed in an evacuated chamber. Temperatures generated by the furnace and conducted to the quartz chamber are typically in the range of 400° C. to 700° C., depending upon the particular process and materials involved. Further, the quartz tube has an inlet and outlet through which various gases can be passed to subject the semiconductor wafers to the desired temperature, as well as various chemical compositions according to a recipe. It is well known that optimum performance and yield of the wafers are dependent upon the uniformity of temperature and gas distribution within the quartz chamber.

While many different types of wafer processing furnaces are available, many such furnaces utilize a quartz chamber having a frontal flanged opening. A wafer paddle assembly, including the furnace door, is externally movable, generally under computer control, for moving the paddle assembly into the horizontally situated quartz chamber. The paddle assembly holds a number of wafers at the end thereof, and has affixed thereto the furnace door that seals to the opening when the paddle assembly is fully inserted into the quartz chamber. The chamber is pumped down to a desired vacuum, the furnace is heated to a desired temperature, and then the appropriate gases are passed through the quartz chamber for depositing various material layers on or in the wafers. Such a process is commonly known as chemical vapor deposition (CVD). Many other processes can be carried out with such furnaces. As noted above, optimum processing occurs in the quartz chamber at a certain location, termed a "sweet spot", where the temperature and chemical composition are maintained at desired parameters prescribed in the processing recipe. By trial and error techniques, or by conducting tests on test wafers, the exact sweet spot location and size of each furnace can be found. In order to precisely place the semiconductor wafers in the sweet spot, the paddle assembly often requires vertical or horizontal adjustments. The paddle assembly itself can generally accommodate small adjustments in a vertical or lateral direction without substantially affecting the seal of the door to the quartz chamber. However, situations often arises in which the paddle assembly cannot be adequately ad3usted in the sweet spot without affecting the seal between the furnace door and the quartz chamber. In this situation, wafer processing must be carried out at a location in the chamber that is suboptimal, thereby compromising the yield of the die on each wafer. As a result, the cost per circuit die increases, and sometimes entire batches of wafers are destroyed or unusable due to an inadequate vacuum seal between the furnace door and processing chamber.

From the foregoing, it can be seen that a need exists for an apparatus and technique for allowing adjustability between the paddle assembly and the furnace door so that a wider degree of adjustability is afforded, without affecting the seal between the furnace door and the temperature chamber. Another need exists for a technique providing the noted adjustability that is simplified and does not require precision equipment, apparatus or a high degree of operator expertise.

SUMMARY OF THE INVENTION

In accordance with the invention, there are disclosed herein techniques and apparatus for providing adjustments of a furnace door with respect to a wafer paddle assembly, thereby avoiding or substantially eliminating the shortcomings of the prior art apparatus and techniques. In accordance with an important aspect of the invention, a furnace door is made adjustable in an eccentric manner with respect to the paddle assembly so that both lateral and vertical adjustments therebetween are available.

According to a preferred embodiment of the invention, a furnace door and associated coupling bellows are mounted around a paddle shaft assembly by a tubular frontal collar and a circular rear spacer plate. Importantly, the frontal collar has a bore formed therethrough offset from a central axis thereof. The spacer plate has a central bore formed halfway therethrough in one face, and an offset bore formed halfway therethrough in the opposite face. A resulting or oblong opening is thus formed through the spacer plate, through which the paddle assembly tube extends. The offset bore in the alignment plate holds a retainer ring around which an 0-ring is placed to seal one end of the bellows to the alignment plate. A similar seal arrangement provides a seal between the other end of the bellows and the furnace door itself. The frontal collar fits within a circular opening in the furnace door, while the spacer ring is rotatably attached and sealed to a back plate that is fixed to the paddle tube. With this arrangement, when it is desired to adjust the paddle tube in a direction that would otherwise result in an inadequate seal between the furnace door and the chamber, the entire spacer plate, bellows, door and collar can be moved to bring the door back into alignment with the frontal surface of the quartz chamber, thereby assuring a suitable seal therebetween and the placement of the wafer paddle in the sweet spot of the furnace.

BRIEF DESCRIPTION OF THE DRAWINGS

Further features and advantages will become apparent from the following and more particular description of the preferred embodiment of the invention, as illustrated in the accompanying drawings in which like reference characters generally refer to the same parts, elements or functions throughout the views, and in which.

DETAILED DESCRIPTION OF THE INVENTION

Figure 1:
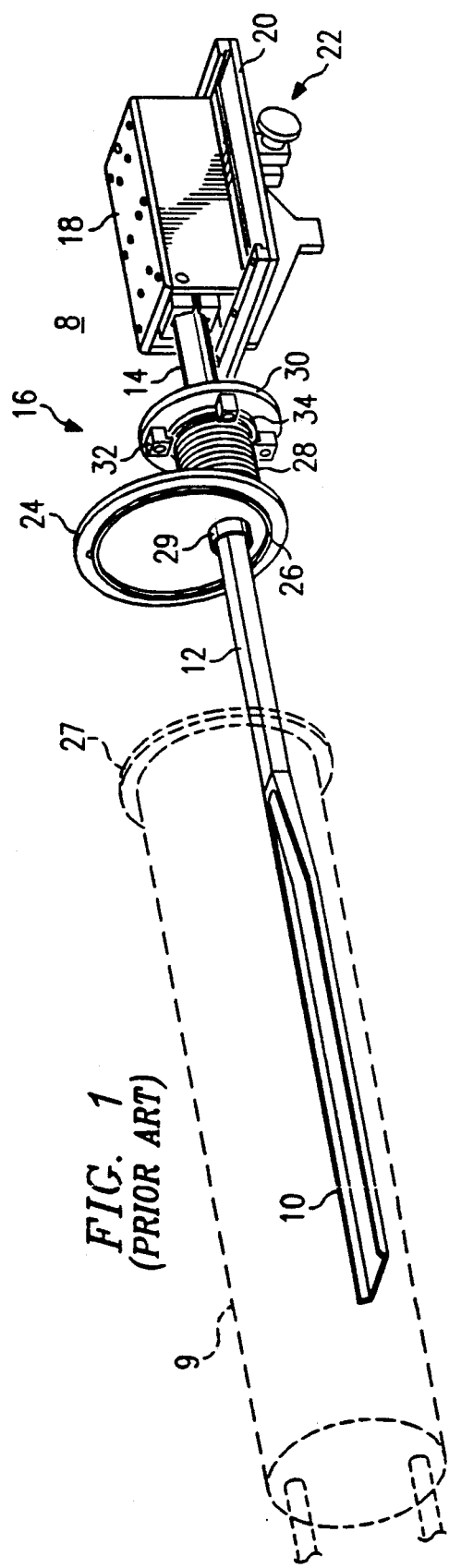
FIG. 1 is an isometric view of a conventional paddle wheel assembly and associated furnace door of the type well known in the field.

In order to facilitate understanding and appreciation of the present invention, the apparatus of the prior art is illustrated in FIG. 1 and described below. Particularly, shown is a wafer paddle assembly 8 commercially available from Cryco-Twenty Two, Inc. The illustrated wafer paddle assembly 8 operates in conjunction with a furnace assembly including a quartz chamber, manufactured by Thermco, identified as Model 22-600. While not shown, the entire wafer paddle assembly 8 is movable laterally into a quartz chamber 9, under computer control, with respect to a furnace (not shown) for the insertion of semiconductor wafers therein to carry out high temperature processing. The wafer paddle assembly 8 includes a silicon carbide paddle 10 shaped to accommodate a number of quartz boats for holding semiconductor wafers. The paddle 10 has an end defined by a square shaft 12 which is held internal to a round paddle holder tube 14. A door and sealing assembly 16 is fixed around the paddle holder tube 14. The paddle holder tube 14 is held by a cantilever clamping assembly 18 which, in turn, is adjustably mounted with respect to a base plate 20. The base plate 20 includes a manual adjustment 22 for providing vertical adjustments of the cantilever clamping assembly 18 and thus adjustments of the wafer paddle 10 within the furnace. While not shown, the base plate 20 is movable laterally by a threaded rod which is rotated by a motor under computer control, thereby laterally moving the entire wafer paddle assembly 8 into and out of the furnace chamber 9. Typically, the lateral travel of the wafer paddle assembly 8 can be about five feet.

The door sealing assembly 16 includes a ten-inch diameter door 24 having an annular O-ring seal 26 fixed to the frontal face thereof. The seal 26 functions to seal the furnace door 24 to the frontal flange 27 of the furnace chamber. Attached to the back side of the furnace door 24 is a metal bellows 28 which is longitudinally expandable and contractable with the door 24 with respect to the square portion of the wafer 12 and paddle 10. The door 24 is longitudinally movable a small amount with respect to the wafer paddle 10 so that the door 24 can be pressed against the flanged opening of the chamber 9 and achieve a seal thereto. In particular, a collar 29 fits between an opening in the door 24 and the square paddle shaft 12. The back side of the bellows 28 is fastened to an attachment plate 30 by four J-shaped brackets 32. A seal 34 is held between the attachment plate 30 and the end of the bellows 28. In this manner, the bellows 28 and the attachment plate 30 allow a vacuum to be maintained within the furnace chamber 9.

As noted above, the manual adjustment 22 can be utilized to adjust the cantilever clamping assembly 18 left and right and thus place the wafer paddle 10 and the semiconductor wafers in the sweet spot of the quartz chamber 9. Other adjustments (not shown) are available to move the paddle 10 in small vertical, angular, and other movements. As can be appreciated, as the wafer paddle 10 is adjusted up or down, the furnace door 24 moves accordingly. Depending upon the amount of movement, which may be 1/16 inch–1.5 inches, the seal 26 may remain flush against the flanged opening 27 of the chamber 9. However, there may be instances in which the seal 26 does not remain in intimate contact with the furnace opening 27, thereby affecting the processing of the wafers. The invention described below in more detail, overcomes this problem.

Figure 2:
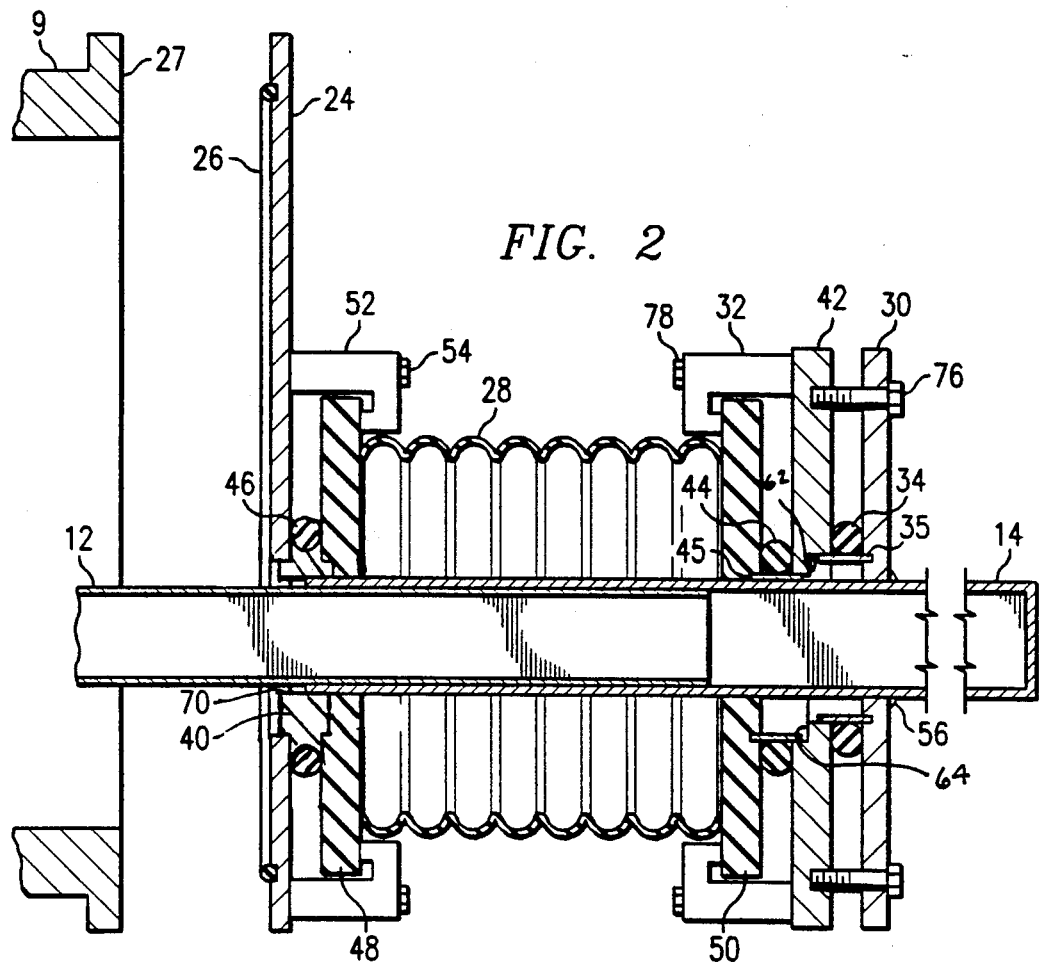
FIG. 2 is a cross-sectional view of the furnace door adjusting apparatus according to the invention.

FIG. 2 illustrates a portion of the wafer paddle assembly with some of the parts as supplied with the original equipment, as well as the new parts which allow the entire assembly to function in accordance with the invention. The originally-provided parts utilized with the invention comprise the paddle 10 and paddle shaft 12, the paddle holder tube 14, the door 24 and associated seal 26, together with the bellows 28, the attachment plate 30, and associated O-ring seal 34 and retainer ring 35 shown in FIG. 2. Of course, the assembly shown in FIG. 2 operates in conjunction with the cantilever clamping assembly 18 and mounting base 20 for providing longitudinal movement of the wafer paddle 10 as well as manual movement in the vertical direction. In accordance with the preferred form of the invention, the original collar 29 is dispensed with, and a new collar 40 is utilized, as well as an alignment plate 42 and an additional O-ring seal 44 and associated retainer ring 45. The bellows 28 is sealed to the furnace door 24 by an O-ring 46 and the new collar 40, which also functions as a retainer ring for the O-ring seal 46. The accordion-type bellows 28 is fixed in a sealed manner at each end thereof with flanges 48 and 50. The front flange 48 is sealed to the furnace door 24 by the O-ring 46 with the assistance of four J-shaped brackets, one shown as reference numeral 52. A bolt 54 passes through the bracket 52 and is threaded into the furnace door 24, thereby compressing the O-ring seal 46 between the bellows front flange 48 and the door 24.

Figure 5:
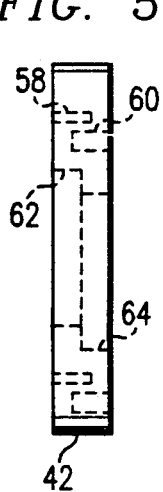
FIGS. 3, 4 and 5 are respective frontal, rear and side views of the alignment plate utilized according to the invention.
Figure 3:
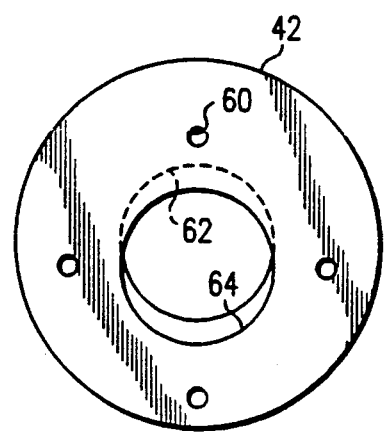

As further noted in FIG. 2, the attachment plate 30 is welded to the paddle holder tube 14 by a circular weld 56. The alignment plate 42, shown in more detail in FIGS. 3, 4 and 5, has thirty-six threaded holes 58 formed in the backside thereof, and four threaded holes 60 formed in the front side thereof. Importantly, the alignment plate 42 includes a 1.375 inch radius bore 62 formed in the back face thereof to a depth of 3/16 inch, and a 1.375 inch radius bore 64 formed in the front face thereof offset from the bore 62 by 7/32 inch. Each bore 62 and 64 is formed halfway through the ⅜ inch thick alignment plate 42. The threaded holes 58 are formed concentrically around the centered bore 62, while the four threaded holes 60 are formed equidistant from the axial axis of the offset bore 64. More particularly, the threaded holes 58 are formed in the back face of the alignment plate 42, spaced apart by ten degrees, at a radius of 2.156 inch from the centered axis about which the central bore 62 is formed. In like manner, the four threaded holes 60 are formed 90 degrees apart and 2.156 inches from the offset axis about which the offset bore 64 is formed. In the preferred embodiment of the invention, the alignment plate 42 is six inches in diameter. The centered bore 62 receives therein the O-ring seal retainer 35, while the offset bore 64 receives therein and holds the retainer ring 45 around which the O-ring 44 is disposed.

Figure 6:
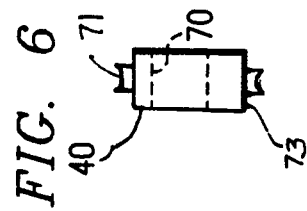
FIGS. 6 and 7 are respective side and frontal views of the alignment collar utilized in accordance with the invention.
Figure 7:
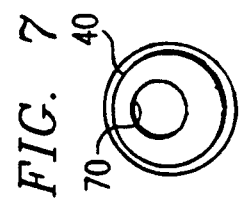

With reference now to FIGS. 6 and 7, there is illustrated the alignment collar 40 that operates in association with the alignment plate 42 in allowing such parts, as well as the bellows 28 to be rotated when vertical door adjustments are required to maintain the door seal 26 registered with the frontal flange 27 of the wafer processing chamber 9. In the preferred embodiment the invention, the alignment collar 40 has an axial length of about ⅝ inch and an outer diameter of about 3.875 inches. A collar bore 70 has a diameter of about 2.0625 inches, which is not the same as that of the outside diameter of the paddle holder tube 14, which is about 2.0 inches. The collar bore 70 is formed about an axis that is offset 19/32 inch from a central axis extending through the collar 40. Formed integral with the collar 40 is an annular O-ring seal 71 for cradling a portion of an O-ring seal disposed therearound. The surface 73 defined by a circumference of the collar 40 rotates freely within a bore formed in the furnace door 24, in which the old collar 29 was previously disposed. Both the alignment plate 42 and the alignment collar 40 are constructed with 316 stainless steel stock. Those skilled in the art may prefer to utilize a modified alignment collar in conjunction with a standard retainer ring, instead of the single collar 40 shown in FIGS. 6 and 7. If an individual retainer ring is used with a modified collar, then the elements may be spot welded together, and the O-ring 46 slipped over the retaining ring. Further, the collar 40 can be of a longer axial length than shown, if it does not interfere with other apparatus located in the quartz chamber 9.

With regard again to FIG. 2, it should be noted that the alignment collar 40 fits within the opening in the furnace door 24, in such a manner that the alignment collar 40 can be manually rotatable therein. Further, it can be seen that the alignment collar 40 provides internal support to an end of the paddle holder tube 14 which, in turn, provides internal support to the square end 12 of the wafer paddle 10.

As further noted in FIG. 2, the attachment plate 30 has four nonthreaded holes therein through which four bolts 76 pass and are threaded into four of the thirty-six threaded holes 58 formed in the back of the alignment plate 42. An elastomeric O-ring 34 is positioned between the attachment plate 30 and the alignment plate 42 for providing a seal therebetween. The retainer ring 35 fits within an annular channel in the attachment rin 30 as well as in the central bore 62 of the alignment plate 42, as described above. While the attachment plate 30 is welded to the paddle holder tube 14, the alignment plate 42 is rotatable about the tube 14 via the opening therethrough that is common to both the central bore 62 and the offset bore 64. Of course, when fastened by the bolts 76 to the attachment plate 30, the parts are not rotatable. As noted above, four J-shaped brackets 32 are bolted by corresponding bolts 78 to the four threaded holes 60 formed in the front side of the alignment plate 42. The elastomeric O-ring 44 is disposed between the alignment plate 42 and the bellows back flange 50 for providing a seal therebetween. The O-ring 44 is disposed around the retainer ring 45, as noted above, and the ring 45 fits within an annular channel formed in the bellows back flange 50, and in the offset bore 64 formed in the front face of the alignment plate. The J-shaped brackets 32 bottom out on the alignment plate 42 when the bolts 78 are tightened, thereby preventing excessive compression of the O-ring 44.

Were it not for the invention depicted in connection with FIG. 2, in an attempt to rotate the door 24 with the apparatus shown in FIG. 1 to achieve alignment with the flanged end of the quartz chamber, the door 24 would be tilted from a vertical plane and thereby exacerbate attempts to achieve a suitable seal to the flanged end 27 of the quartz chamber 9. However, by utilizing the principles and concepts of the invention, movements of the wafer paddle 10 occasioned by the manual cantilever clamping assembly adjustments which otherwise would result in misalignment of the furnace door 24, can be compensated or offset by corresponding rotational adjustments of the alignment plate 42, the bellows 28, the alignment collar 40 and even the door 24 itself. In other words, when the wafer paddle 10 is ideally adjusted in one direction within the quartz chamber in the sweet spot thereof, the alignment collar 40, the bellows 28 and the alignment plate 42 can be rotatably adjusted in an opposite direction to thereby move the furnace door 24 to a position to maintain its alignment with the flanged end 27 of the quartz chamber 9, while yet maintaining the furnace door 24 in a vertical plane. It should be noted that the furnace door 24 itself need not be rotated, but does move in a plane when the collar 40 is rotated about the paddle tube 14. On certain occasions, the furnace door 24 itself may need to be rotated to achieve the proper alignment with the quartz chamber flange 27. The bellows 28 and its end flanges 48 and 50 are also rotated in correspondence with the collar 40 so that the axis of the assembly remains parallel to the axis of the paddle tube 14. The alignment plate 42 is also rotatably adjusted, which adjustment moves the O-ring 44 and retainer ring 45 on the bellows side thereof, but does not move the O-ring 34 and associated retainer ring 35 on the attachment ring 30 side thereof. This latter action results as the central bore 62 is centered in the alignment plate 42 on the O-ring 34 side, while the offset bore 64 is displaced from the center of the alignment plate 42 on the bellows side. Were it not for the tendency of the furnace door to tilt when only the collar 40 is rotated, the back flange 50 and alignment plate 42 would not need to be provided with offset apparatus. In other words, if the bellows 28 were of the type that could be bent so as to exhibit a circuitous axial axis, only the collar 40 would be adjusted to displace the furnace door 24 without also having to rotate the alignment plate 42 and the bellows 28.

Figure 4:
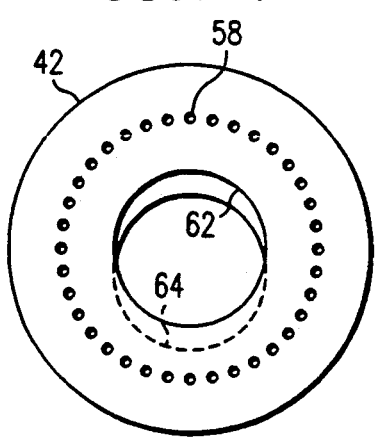

The manner in which the foregoing adjustments are accomplished is described in the following manner. First, the four bolts 54 are loosened so that the J-shaped brackets 52 allow the bellows front flange 48 to be rotated with respect to the furnace door 24 which is not rotated. The loosened bolts 54 also allow the collar 40 to be rotated. The four bolts 76 passing through the attachment plate 30 are completely removed from their threaded engagement in the alignment plate 42. The bolts 78 remain tightened in the front side of the alignment plate 42. Then, the alignment plate 42 and attached bellows 28 are rotated as a unit an angular amount sufficient to provide appropriate vertical adjustment for the furnace door 24. In like manner, the alignment collar 40 is loosened by loosening bolts 54 as noted above, and the collar is also rotated in the same direction and amount as the alignment plate 42. The adjustment of the alignment collar 40 brings the furnace door 24 back into a vertical plane so that a suitable seal can be maintained between the O-ring 26 and the frontal flange 27 of the quartz chamber 9. The four bolts 76 are then threaded into four of the corresponding thirty-six threaded holes 58 and tightened. Then, the bolts 54 are tightened so that the J-shaped brackets 52 secure and seal the alignment collar 40 between the bellows front flange 48 and the rear surface of the furnace door 24. If finer rotational adjustments of the alignment plate 42 and the bellows 28 are required, then additional threaded holes 58 can be formed in the back face of the alignment plate 42 as shown in FIG. 4.

Figure 8:
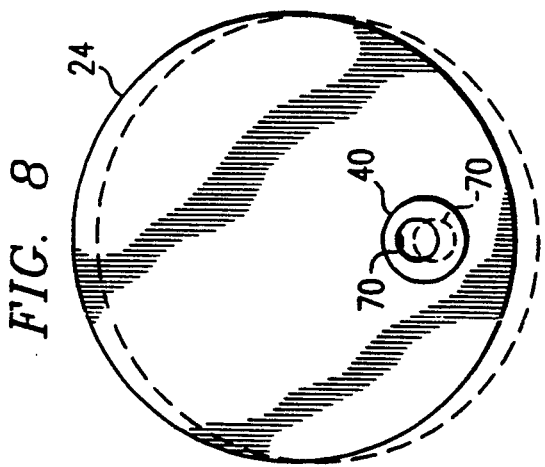
FIG. 8 is a generalized frontal view of the furnace door in different positions occasioned by rotation of the alignment collar.

As can be appreciated from the foregoing, because both the alignment plate 42 and the alignment collar 40 have offset bores formed therethrough, the rotational movement of both such members causes the apparatus associated therewith to be also moved along an axis that is parallel to, but offset from that of the paddle tube 14. As noted above, whether or not the furnace door 24 is itself rotated, it is required to move in a vertical plane to maintain registration with the vertical flanged surface 27 of the quartz chamber. This aspect is shown in FIG. 8. The furnace door 24 is shown in solid line in a position when the offset bore 70 of the alignment collar 40 is rotated in its uppermost vertical position, while the broken line depicts the furnace door 24 lowered a maximum amount by the rotation of the collar 40 so that the offset bore 70 is in its lowermost vertical position. As noted, the opening in the door 24 through which a portion of the collar 40 is disposed does not move as a result of collar rotation. The door 24 does move when the entire paddle assembly 8 is moved by movement of the cantilever clamping assembly 18. Of course, intermediate positions of the furnace door 24 can be achieved by rotation of the collar 40 to positions intermediate that shown in FIG. 8, although the furnace door will encounter slight horizontal displacements at such positions. This sideways displacement of the door 24 is compensated by counter rotation of the door to bring the sealing ring 26 centered with respect to the furnace flange 27.

From the foregoing, the invention provides a technique for adjusting CVD furnaces without affecting the placement of the process loads as located on the paddle. While the preferred embodiment of the invention has been disclosed with reference to specific furnace door alignment apparatus, it is to be understood that many changes in detail may be made as a matter of engineering choices, without departing from the spirit and scope of the invention, as defined by the appended claims.

What is claimed is:

1. Furnace door alignment apparatus, comprising:
a furnace door movable with respect to an opening in said furnace, said door having an opening through which paddle apparatus is disposed so that said paddle apparatus is located in the furnace while said door is sealed to the furnace opening; and
an alignment collar supporting said paddle apparatus with respect to said furnace door, said alignment collar having a bore therein through which said paddle apparatus passes, and said bore being offset from a central axis of said alignment collar so that when said alignment collar is rotated about said paddle apparatus, said door is moved with respect to said central axis.

2. The furnace door alignment apparatus of claim 1, wherein said alignment collar has an annular area therearound for accommodating an O-ring type of seal.

3. The furnace door alignment apparatus of claim 1, further including an alignment plate having a central axis, and a bore in said alignment plate being offset with respect to the central axis of the alignment plate, said alignment plate bore being sized for passing the paddle apparatus therethrough.

4. The furnace door alignment apparatus of claim 3, wherein said alignment plate includes a central bore and an offset bore, each bore formed halfway through the alignment plate in opposing faces thereof, and said paddle apparatus passes through a bore portion that is common to said central and offset bores.

5. The furnace door alignment apparatus of claim 4, further including a bellows attachable to said alignment plate, and a seal engageable with said offset bore in said alignment plate.

6. The furnace door alignment apparatus of claim 3, further including a bellows attachable to said alignment plate at one end of the bellows and attachable to said furnace door at an opposite end thereof.

7. The furnace door alignment apparatus of claim 6, wherein said bellows includes a front flange and a back flange, and further including a pair of O-ring seals for sealing respectively to said front and back bellows flanges.

8. The furnace door alignment apparatus of claim 6, further including an attachment plate fixed to said paddle apparatus, and means for fastening the alignment plate to said attachment plate.

9. The furnace door alignment apparatus of claim 8, wherein said alignment plate includes threaded holes in a back face thereof for attachment by bolts to said attachment plate, said bellows having a front and back flange, and a plurality of threaded holes in a front face of said alignment plate for attachment to said bellows back flange.

10. The furnace door alignment apparatus of claim 9, wherein said alignment plate is fastened to said bellows back flange by a plurality of bolts and associated J-shaped brackets.

11. Furnace door alignment apparatus for use with a water processing furnace, comprising:
a furnace door movable with respect to an opening in said furnace, said door having an openign through which padde apparatus is disposed so that said paddle apparatus is disposed in the furnace while said door is sealed to the furnace opening;
an attachment plate fixed with respect to said paddle apparatus;
an alignment plate having a central axis, and a bore in said alignment plate offset with respect to said central plate axis, said alignment plate bore being sized for passing the paddle apparatus therethrough;
an alignment collar having a central axis, and a bore in said alignment collar being offset with respect to said alignment collar central axis, said alignment collar bore supporting the paddle apparatus and fitting within the opening in said furnace door;
a bellows having a front end sealed to said furnace door, and a back end with a seal arrangement engageable with the offset bore in said alignment plate;
means for selaing the furnace door to said wafer processing furnace; and
said alignment plate and said alignment collar being movable at desired angular positions with respect to said paddle apparatus.

12. The furnace door alignment apparatus of claim 11, wherein said bellows seal arrangement includes a retainer ring disposed in the offset bore of said alignment plate, and an O-ring disposed around said retainer ring.

13. The furnace door alignment apparatus of claim 11, further including a plurality of threaded holes in one side face of said alignment plate, and means for fixing said attachment plate to said alignment plate using said threaded holes.

14. The furnace door alignment apparatus of claim 13, wherein said alignment plate includes a central bore formed in oen face thereof and halfway therethrough, and said offset bore is formed halfway through said alignment plate on an opposite face thereof, thereby forming a bore portion common to said central and offset bores, said paddle assembly passing through said common bore portion.

15. The furnace door alignment apparatus of claim 13, wherein said alignment plate includes a plurality of threaded holes in an opposite face for fastening thereto said bellows.

16. The furnace door alignment apparatus of claim 11, wherein said alignment collar includes an annular groove therearound for accommodating an O-ring therein.

17. A method for adjusting a furnace door with respec to a furnace opening in wafer processing furnace equipment of the type having a furnace and a door held against an opening in the furnace, and wafer paddle apparatus disposed through the door and attachable thereto, and a bellows and seals for sealing the furnace door to the paddle apparatus, the method comprising the steps of:

mounting an alignment plate for angular movements about said paddle apparatus;

mounting an alignment collar for angular movements about said paddle apparatus;

mounting the bellows to said alignment plate so that angular movements of said alignment plate displace a central axis of said bellows from a central axis of said paddle apparatus;

mounting the alignment collar to the furnace door so the angular movements thereof cause a central axis of the door to be displaced from the central axis of said paddle apparatus; and mounting the bellows to the furnace door.

18. The method of claim 17, further including forming an offset bore in said alignment plate and an offset bore in said alignment collar, and passing both said offset bores said paddle apparatus.

19. The method of claim 18, further including engaging a seal ring to said offset bore in said alignment plate so that a seal engaged with said seal ring moves with said bellows.

20. The method of claim 17, further including attaching said alignment plate to an attachment plate that is fixed to said paddle apapratus.

21. The method of claim 20, further including sealing said attachment plate to said alignment plate with an O-ring seal and a retainer ring so that said O-ring does not move with respect to the paddle apparatus axis when said alignment plate is rotated.

22. The method of claim 17, further including rotating said alignment collar about its offset axis, thereby moving said furnace door in a vertical plane without tilting the furnace door.

* * * * *

UNITED STATES PATENT AND TRADEMARK OFFICE
CERTIFICATE OF CORRECTION

PATENT NO. : 5,208,961
DATED : May 11, 1993
INVENTOR(S) : Marc S. Lajoie

It is certified that error appears in the above-indentified patent and that said Letters Patent is hereby corrected as shown below:

```
Col. 8, line 39, change "water" to --wafer--.
Col. 8, line 41, change "openign" to --opening--.
Col. 8, line 42, change "padde" to --paddle--.
Col. 8, line 61, change "selaing" to --sealing--.
Col. 9, line 10, change "oen" to --one--.
Col. 9, lines 27 & 28, change "respec" to --respect--.
Col. 10, line 16, after "passing", insert --through--.
Col. 10, line 24, change "apapratus" to --apparatus--.
```

Signed and Sealed this

Fifteenth Day of March, 1994

Attest:

BRUCE LEHMAN

*Attesting Officer*    *Commissioner of Patents and Trademarks*